United States Patent
Nishikawa

(10) Patent No.: US 7,122,832 B2
(45) Date of Patent: Oct. 17, 2006

(54) ELECTROLUMINESCENCE DISPLAY DEVICE WITH LIGHT SHIELDING FILM

(75) Inventor: Ryuji Nishikawa, Gifu (JP)

(73) Assignee: Sanyo Electric Co., Ltd., (JP)

( * ) Notice: Subject to any disclaimer, the term of this patent is extended or adjusted under 35 U.S.C. 154(b) by 0 days.

(21) Appl. No.: 10/982,264

(22) Filed: Nov. 5, 2004

(65) Prior Publication Data

US 2005/0082540 A1    Apr. 21, 2005

Related U.S. Application Data

(63) Continuation of application No. 09/676,234, filed on Sep. 29, 2000, now Pat. No. 6,958,740.

(30) Foreign Application Priority Data

Oct. 1, 1999    (JP) .................................. 11-281790

(51) Int. Cl.
    *H01L 29/04*    (2006.01)
(52) U.S. Cl. ............................ 257/59; 257/49; 257/52; 257/57; 257/E29.151
(58) Field of Classification Search ...................... None
    See application file for complete search history.

(56) References Cited

U.S. PATENT DOCUMENTS

| | | | |
|---|---|---|---|
| 4,759,610 A | 7/1988 | Yanagisawa | |
| 5,670,792 A | 9/1997 | Utsugi et al. | |
| 5,684,365 A | 11/1997 | Tang et al. | |
| 6,072,450 A * | 6/2000 | Yamada et al. | |
| 6,114,715 A | 9/2000 | Hamada | |
| 6,133,693 A * | 10/2000 | Keyser | |
| 6,194,837 B1 | 2/2001 | Ozawa | |
| 6,246,179 B1 | 6/2001 | Yamada | |
| 6,366,025 B1 | 4/2002 | Yamada | |
| 6,512,504 B1 | 1/2003 | Yamauchi et al. | |

FOREIGN PATENT DOCUMENTS

JP        10-214043        8/1998

* cited by examiner

*Primary Examiner*—Nathan Flynn
*Assistant Examiner*—Kevin Quinto
(74) *Attorney, Agent, or Firm*—Cantor Colburn LLP

(57) ABSTRACT

An EL element and an interface between a channel and an impurity diffusion area of a thin film transistor provided in the vicinity of the EL element are spaced apart. A light shielding film is provided between the EL element and the interface. By providing such a space and/or the light shielding film, generation of a leak current, which would otherwise be caused by light emitted from the self-emissive EL element entering the TFT, is reliably prevented, thereby ensuring that emitted light is not brighter than a predetermined luminance.

14 Claims, 8 Drawing Sheets

ELECTROLUMINESCENCE DISPLAY DEVICE WITH LIGHT SHIELDING FILM

CROSS-REFERENCE TO RELATED APPLICATION

This application is a continuation of U.S. patent application Ser. No. 09/676,234, filed Sep. 29, 2000 now U.S. Pat. No. 6,958,740, the entire contents of which are incorporated herein by reference.

BACKGROUND OF THE INVENTION

1. Field of the Invention

The present invention relates to an electroluminescence display device comprising electroluminescence elements and thin film transistors.

2. Description of the Prior Art

In recent years, electroluminescence (referred to herein after as "EL") display devices comprising EL elements have gained attention as potential replacements for CRTs and LCDs. Research has been directed to the development of EL display devices using, for example, thin film transistors (referred to hereinafter as "TFT") as switching elements to drive the EL elements.

FIG. 1 is a plan view showing a display pixel of an organic EL display device. FIG. 2A shows a cross-sectional view taken along line A—A of FIG. 1 while FIG. 2B shows a cross-sectional view taken along line B—B of FIG. 1.

As shown in these drawings, a display pixel 20 is formed in a region surrounded by a gate line GL and a data line DL. A first TFT serving as a switching element is disposed near an intersection of those lines. The source of the TFT 1 simultaneously functions as a second capacitor electrode 3 such that, together with a first capacitor electrode 2, it forms a capacitor 8. The source is connected to a gate electrode 15 of a second TFT 4 that drives the organic EL element. The source of the second TFT 4 contacts with an anode 6 of the organic EL element, while the drain of the TFT 4 is connected to a power source line (drive line) VL.

The first capacitor electrode 2, which is made of a material such as chromium, overlaps, over a gate insulating film 7, the second capacitor electrode 3 integral with the source of the first TFT 1. The first capacitor electrode 2 and the second capacitor electrode 3 together store charges with the gate insulating film 7 being interposed therebetween as a dielectric layer. The storage capacitor 8 serves to retain voltage applied to the gate electrodes 15 of the second TFT 4.

The first TFT 1, the switching TFT, will now be described.

First gate electrodes 11 made of refractory metal such as chromium (Cr) or molybdenum (Mo) are formed on a transparent insulator substrate 10 made of quartz glass, non-alkali glass, or a similar material. As shown in FIG. 1, the first gate electrodes 11 are integrally formed with the gate line GL such that a plurality of these electrodes extend from the gate line GL in the vertical direction in parallel with each other. Referring to FIG. 2A, the first capacitor electrode 2 formed in the same process as that of the first gate electrodes 11 is provided to the right side of the first gate electrodes 11. This first capacitor electrode 2, which constitutes the storage capacitor 8, has an enlarged portion between the first TFT 1 and the second TFT 4 as shown in FIG. 1 and is integral with a storage capacitor line CL extending therefrom in the directions.

A first active layer 12 composed of poly-silicon (referred to hereinafer as "p-Si") film is formed on the gate insulating film 7. The first active layer 12 is of a so-called LDD (Lightly Doped Drain) structure. Specifically, low-concentration regions are formed on both sides of the gate. Source and drain regions, which are high-concentration regions, are further disposed on the outboard sides of the low-concentration regions. On the first active layer 12, a stopper insulating film 13 made of Si oxidation film is formed so as to prevent ions from entering the first active layer 12.

An interlayer insulating film 14 formed by sequential lamination of a $SiO_2$ film, a SiN film, and a $SiO_2$ film is provided on the entire surface over the gate insulating film 7, the active layer 12, and the stopper insulating film 13. The data line DL which functions as a drain electrode is electrically connected, through a contact hole C1 formed in the interlayer insulating film 14, to the drain in the active layer 12. A planarizing insulating film 18 made, for example, of an insulating organic resin is also formed over the entire surface for planarization.

In EL display devices which are driven by an electric current, the EL layers must have a uniform thickness. Otherwise, current concentration may occur in a portion of the layer having thinner thickness. Thus, a significantly high level of planarity is required at least in portions where the EL elements are to be formed, and therefore the above-described planarizing film 18 made of a material having fluidity prior to hardening is employed.

The second TFT 4 which drives the organic EL element will be described with reference to FIGS. 1 and 2B.

On the insulating substrate 10, second gate electrodes 15 made of the same material as the first gate electrodes 11 are provided, and a second active layer 16 is further formed on the gate insulating film 7. Then, a stopper insulating film 17 is formed on the second active layer 16 in a manner similar to the above-mentioned stopper insulating film 13.

Intrinsic or substantially intrinsic channels are formed in the second active layer 16 above the gate electrodes 15, and source and drain regions are formed on respective sides of these channels by doping p-type impurities, thereby constituting a p-type channel TFT.

The above-described interlayer insulating film 14 is provided on the entire surface over the gate insulating film 7 and the second active layer 16, and the power source line VL is electrically connected, through a contact hole C2 formed in the interlayer insulating film 14, to the drain in the active layer 16. Further, the planarizing film 18 is formed over the entire surface, such that the source is exposed through a contact hole C3 formed in the planarizing film 18 and the interlayer insulating film 14. A transparent electrode made of ITO (Indium Tin Oxide) that contacts the source through this contact hole C3, namely, the anode 6 of the organic EL element 20, is formed on the planarizing insulating film 18.

The organic EL element 20 is formed by laminating, in order, the anode 6, an emissive element layer EM comprising a first hole transport layer 21, a second hole transport layer 22, an emissive layer 23 and an electron transport layer 24, and a cathode 25 made of a magnesium-indium alloy. The cathode 25 is substantially disposed over the entire surface of the organic EL elements.

The principle and operation for light emission of the organic EL element is as follows. Holes injected from the anode 6 and electrons injected from the cathode 25 recombine in the emissive layer 23, to thereby excite organic molecules constituting the emissive layer 23, thereby generating excitons. Through the process in which these excitons undergo radiation until deactivation, light is emitted from the emissive layer. This light radiates outward through the transparent anode via the transparent insulator substrate and resultant light emission is observed.

The above-described EL elements are expected to be actively developed, and pixel size must be minimized to the greatest possible extent in order that the number of pixels disposed in a limited display pixel area can be maximized to achieve higher resolutions.

This requirement will be described with reference to FIG. 1. Various spaces must be reduced, such as the space between the anode 6 and the second gate electrode 15, the space between the anode 6 and the gate line GL for the pixel located in the next row, and the space between the storage capacitor 8 and the anode 6.

However, because the EL element is a self emissive element, a leak current is generated at the TFT when the light emitted by the element is introduced into the active layer of the TFT, whereby the amount of current supplied to the EL element is increased and the luminance is higher than actually required for that EL element. Consequently, the display emission can not accurately realize the display data.

In monochrome displays, this problem manifests itself as a situation in that display areas that should be gray are displayed a whiter shade than intended.

SUMMARY OF THE INVENTION

The present invention has been conceived in view of the above-described problems, and solves the problems by separating, from an emissive layer, an interface between a channel of a thin film transistor and one of first and second conductive regions connected to an EL element.

According to another aspect of the invention, a first thin film transistor connected to a data line, and a second thin film transistor having a third and a fourth conductive regions, one of which regions connected to an EL element are provided, and an interface between a channel of the second thin film transistor and the conductive region connected to the EL element is spaced apart from an emissive layer.

Generation of a leak current is prominent when light enters a depletion layer formed in the vicinity of a junction interface (interface between a channel and a source or drain). While the leak current generated in the interface of one of the first and second or the third and fourth conductive regions of the TFT is controlled by a gate electrode before flowing into the EL element, the leak current generated in the other conductive region connected to the EL element cannot be controlled and flows into the EL element. Consequently, by providing a space between the EL element and the end of the depletion layer located closer to the conductive region connected to the EL element, the area near the end of the depletion layer is protected from exposure to light from the EL element.

According to still another aspect of the present invention, a light shielding film for shielding light emitted from the EL element is provided between the EL element and the interface between the channel and the conductive region connected to the EL element.

According to a further aspect of the present invention, a first thin film transistor connected to a data line and a second thin film transistor having a third and a fourth conductive regions, one of which regions connected to an EL element are provided, and a light shielding film is provided for blocking light emitted from the EL element from entering an interface between a channel of the second thin film transistor and the conductive region connected to the EL element.

By forming a light shielding film over the conductive region, connected to the EL element, of the second TFT which is connected to the EL element and would otherwise be problematic as described above, light emitted from the EL element can be completely blocked.

According to a further aspect of the present invention, a light shielding film for shielding light emitted from the EL element is provided over a semiconductor layer of the thin film transistor or over a semiconductor layer of the first and/or second thin film transistor.

According to a further aspect of the present invention, a first or second electrode of the thin film transistor also serves as the light shielding film. As a result, the light shielding film can be formed without requiring any additional or special steps. Further, the resistance of a power source line can be easily reduced by connecting the light shielding film and a power source of the EL element.

According to a further aspect of the present invention, a light shielding film having an opening at a position corresponding to the EL element is provided in a layer underlying the thin film transistor.

Light entering the semiconductor layer from outside through the transparent substrate can be blocked by the light shielding film, thereby preventing generation of a leak current.

According to a further aspect of the present invention, the light shielding film underlying the above transistor is electrically connected to the power source of the thin film transistor, and the light shielding film provided between the transistor and the EL element is electrically connected to the first or second electrode of the thin film transistor. Such a structure prevents generation of leak current at the TFT and prevents reduction in line resistance, so that variation in luminance among various positions in the display area can be suppressed. The light shielding film also allows elimination of the power source line.

According to a further aspect of the present invention, the opening of the light shielding film is located inner than the emissive layer.

According to a further aspect of the present invention, a light shielding film having an opening at a position corresponding to the EL element is provided in a layer underlying the thin film transistor, and this opening of the light shielding film is formed inner than an outer edge of the emissive region of the emissive element.

Consequently, in contrast to related art devices wherein image areas to be displayed in gray are displayed whiter than proper and color reproducibility in each of gray levels is lost, the present invention suppresses generation of a leak current, thereby improving color reproducibility of gray colors. Further, as a light shielding film having an opening corresponding to a portion (emissive layer) of the EL element is employed, a sharp display is obtained for each pixel and improvement in image sharpness and mixture in color can be achieved.

DESCRIPTION OF THE PREFERED EMBODIMENTS

Figure 1:
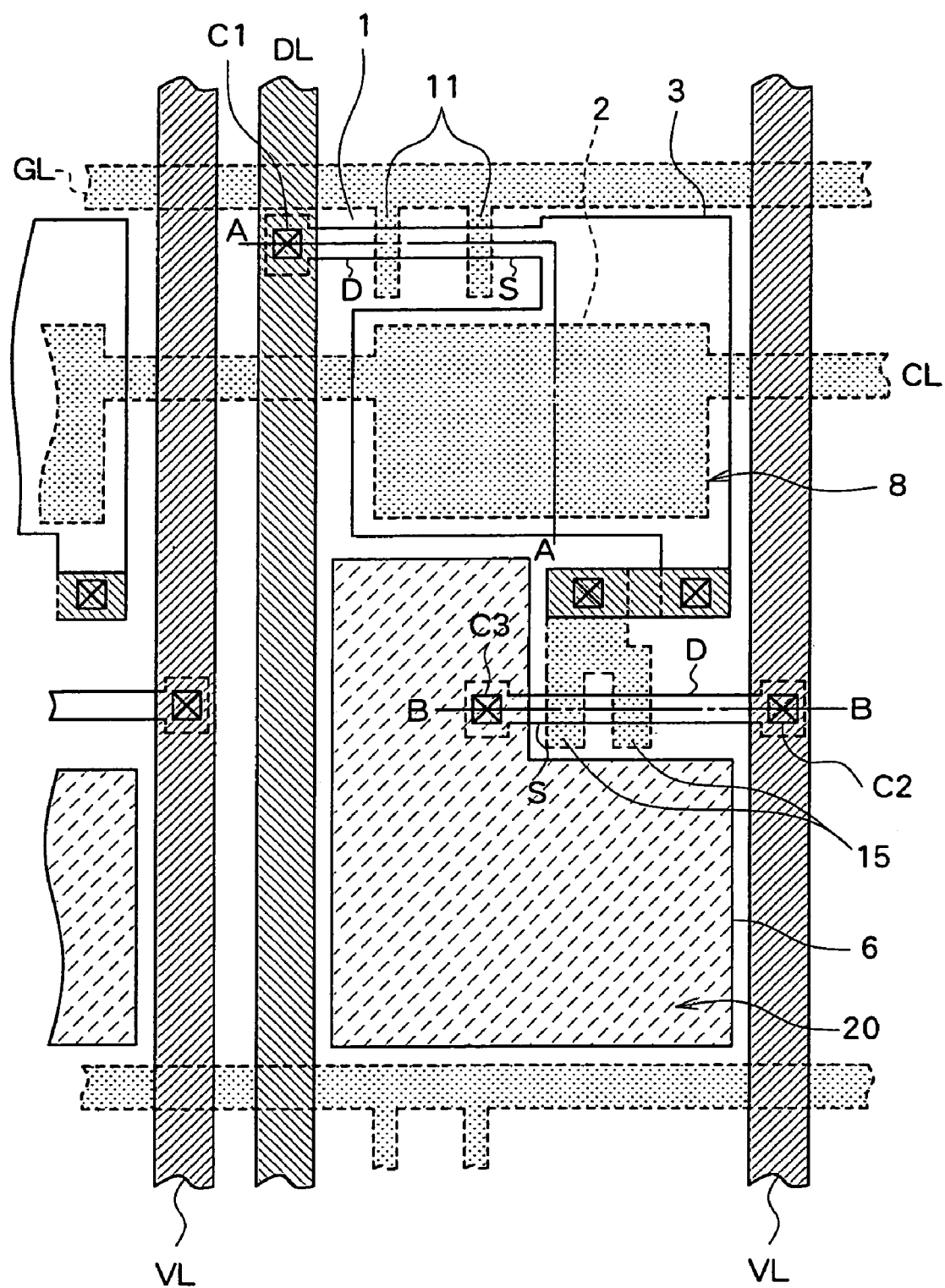
FIG. 1 is a plan view illustrating a display pixel of an EL display device according to a prior art.
Figure 2A:
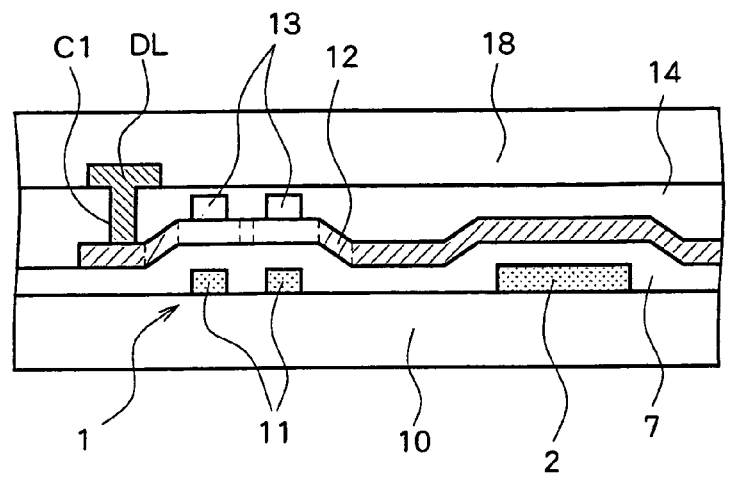
FIG. 2A is a cross sectional view taken along the line A—A in FIG. 1.
Figure 2B:
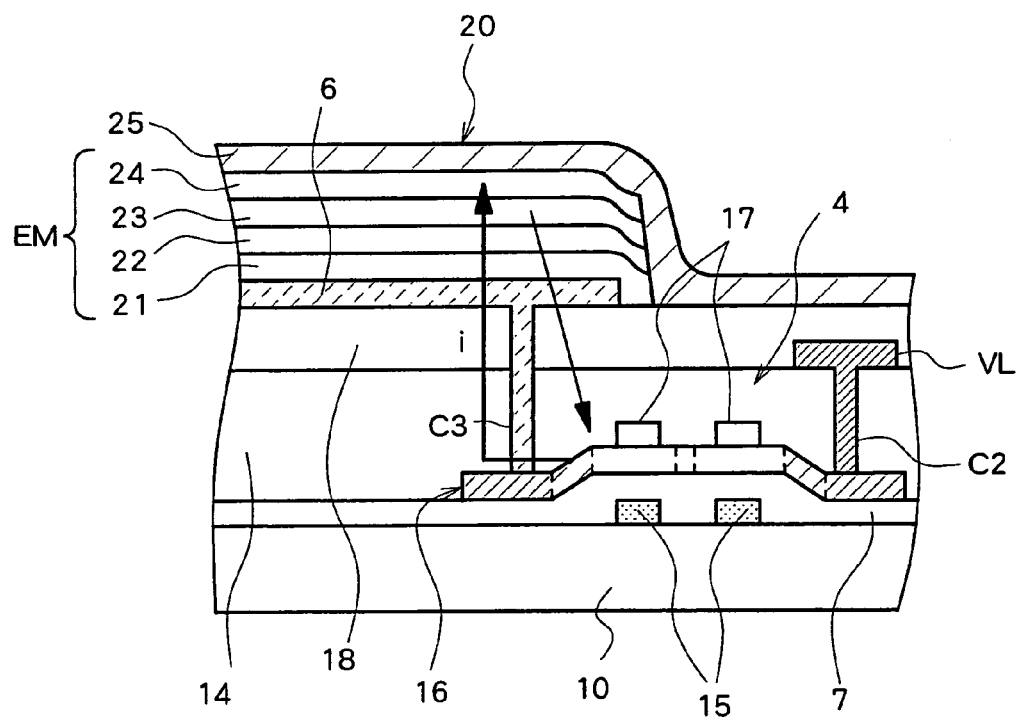
FIG. 2B is a cross sectional view taken along the line B—B in FIG. 1.
Figure 3:
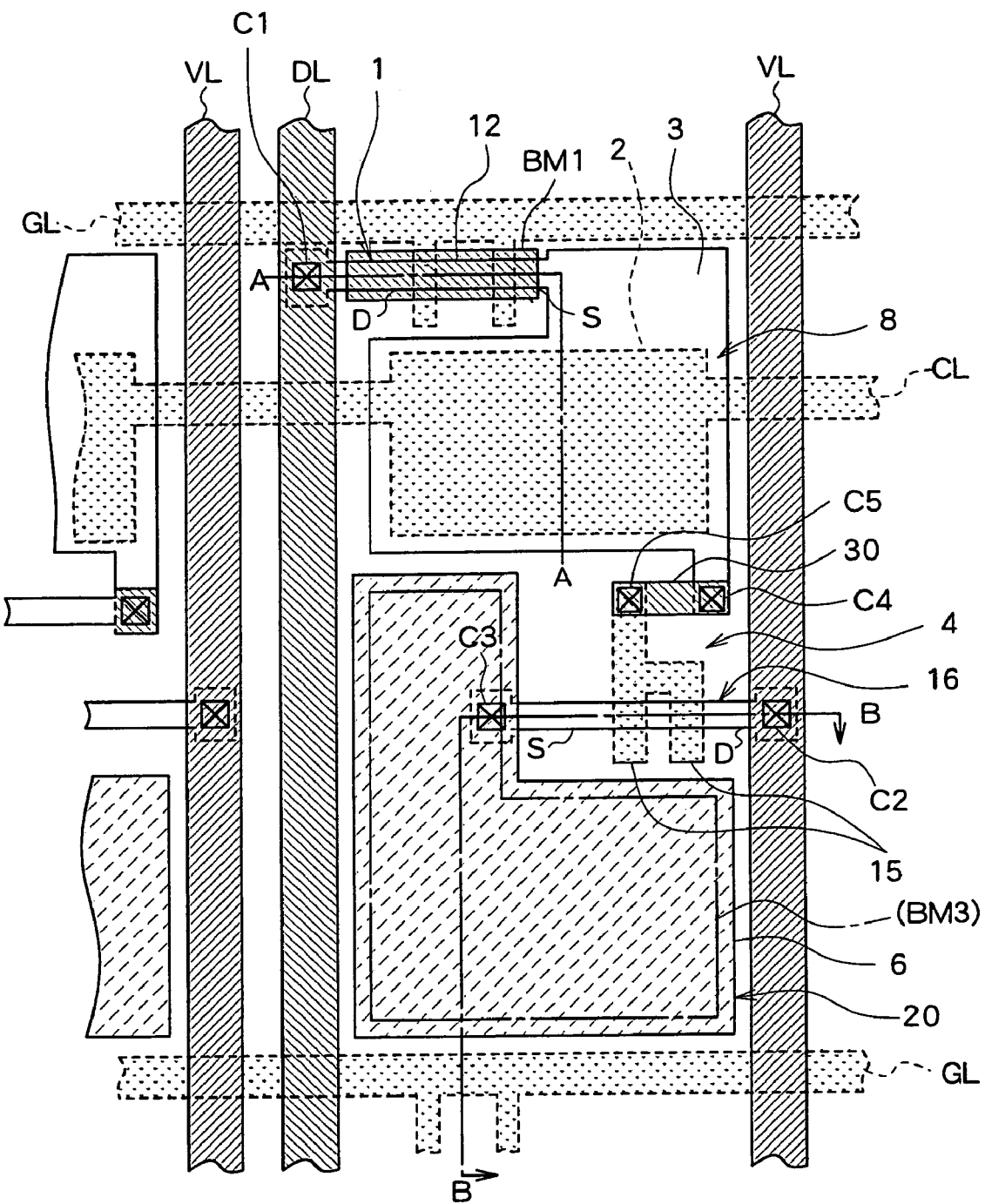
FIG. 3 is a plan view illustrating a display pixel of an EL display device of the present invention.

Preferred embodiments of the electroluminescence display device of the present invention will now be described. FIG. 3 is a plan view illustrating a display pixel of an EL display device of a bottom gate type. Regions surrounded by dotted lines and shaded by dots are a gate line GL, gate electrodes 11 and 15, a first capacitor electrode 2, and a line CL, formed of a gate material. Regions surrounded by solid lines and without hatching are formed of a Si layer (P—Si layer in this example), namely, active layers 12 and 16 of the TFTs and a second capacitor electrode 3 formed integrally with the active layer 12. A region provided in a lower part of the pixel and surrounded by solid lines in the figure is a transparent electrode serving as an anode 6 of the EL element. Regions surrounded by solid lines and indicated by hatching with slant lines are lines VL, DL and 30, and a light shielding layer BM, containing Al as a main material.

Figure 4:
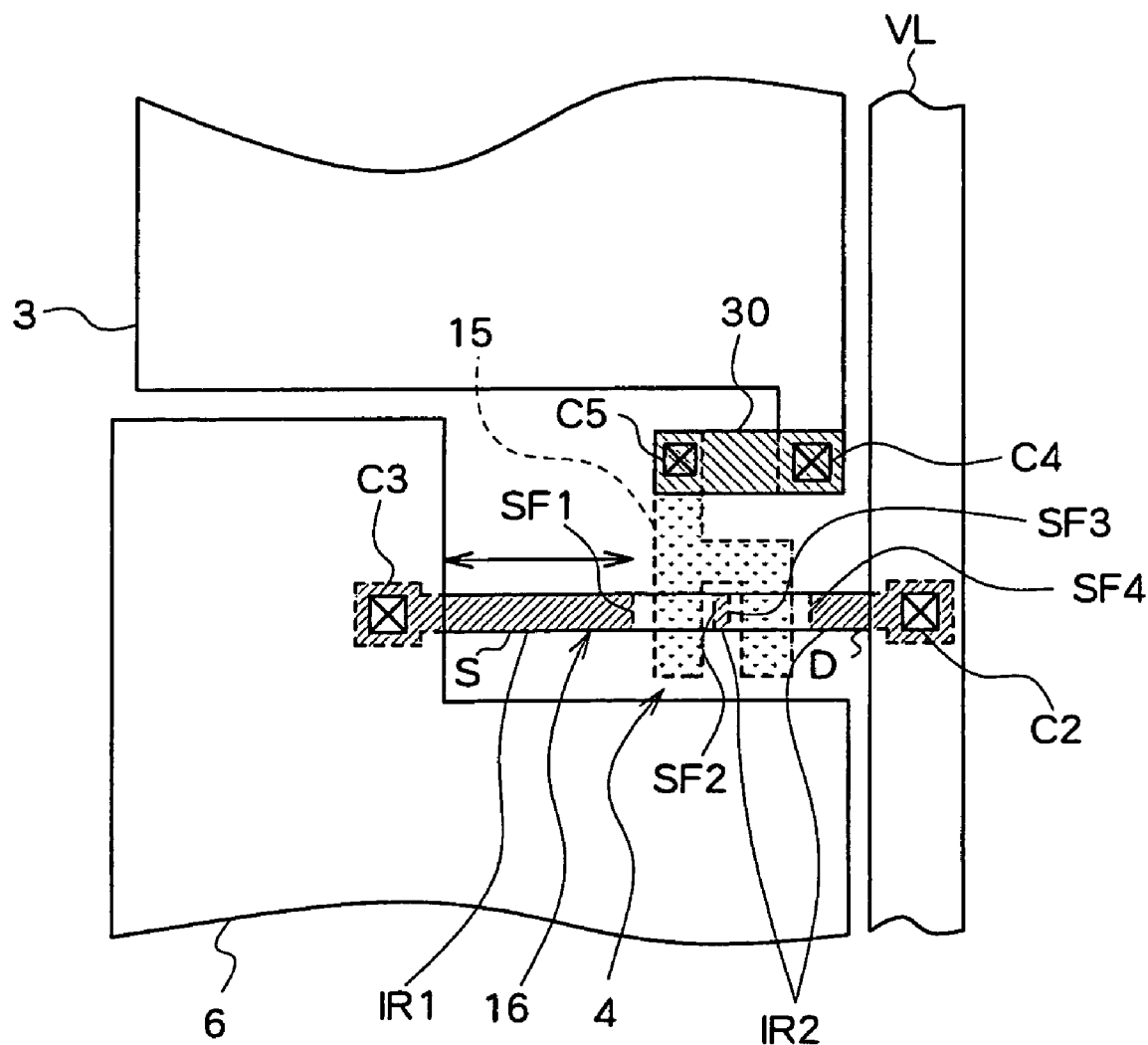
FIG. 4 illustrates a structure example of a second TFT shown in FIG. 3.
Figure 5A:
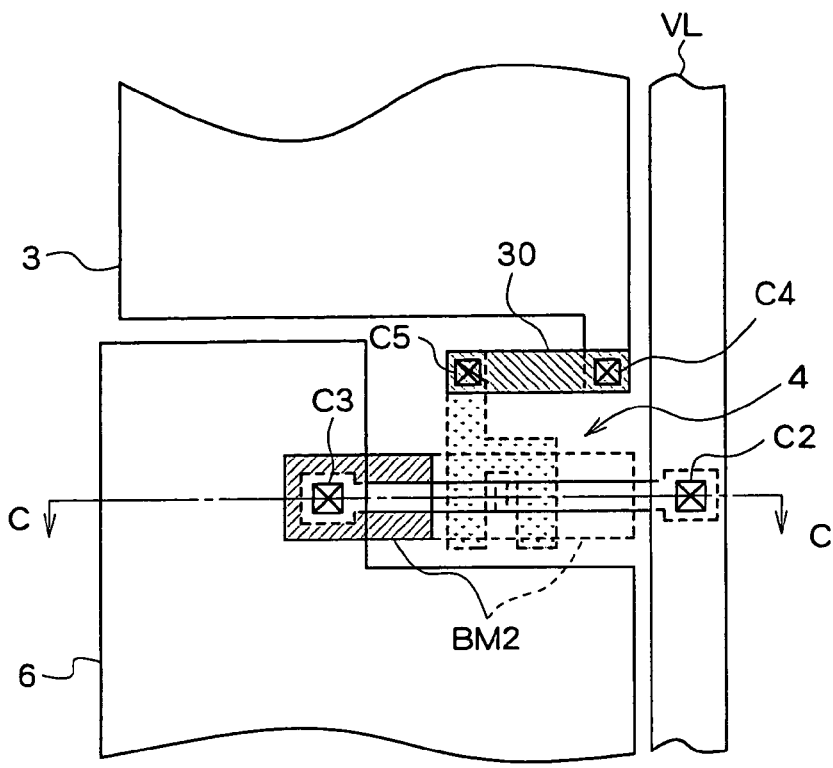
FIG. 5 illustrates another structure example of the second TFT shown in FIG. 3.
Figure 5B:
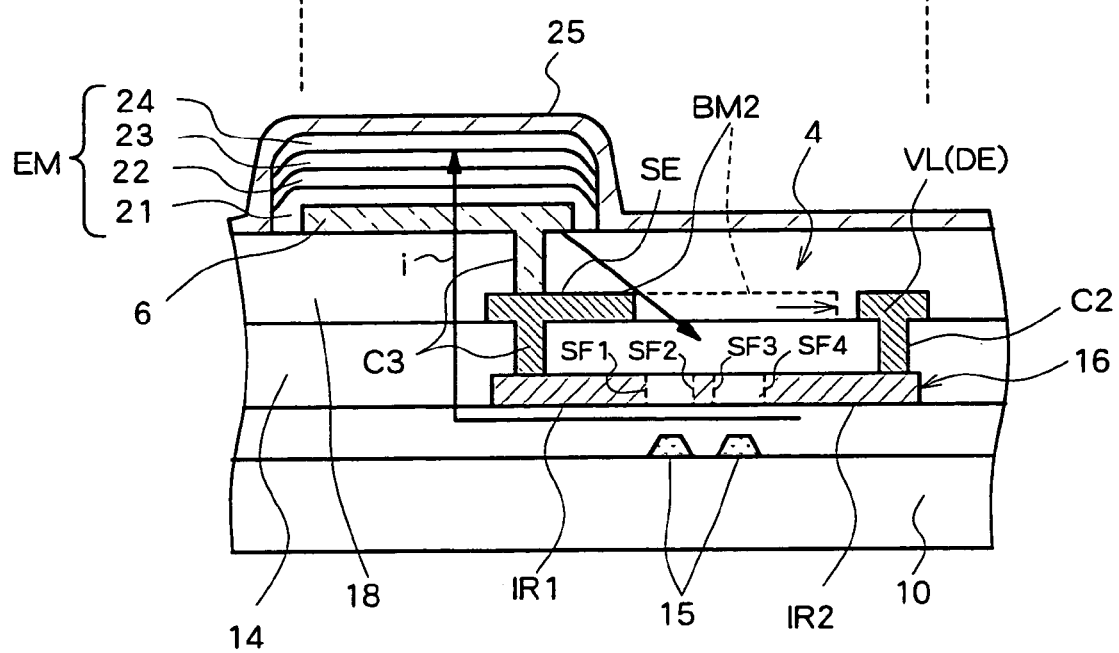
Figure 6:
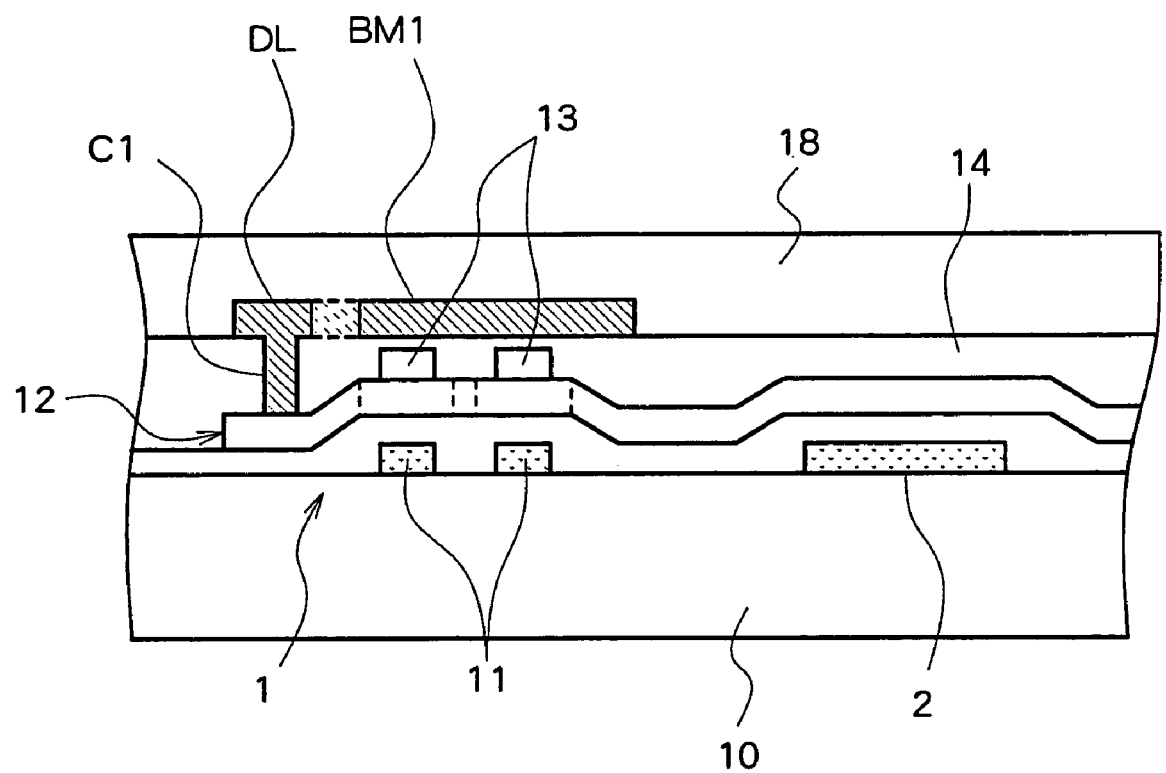
FIG. 6 is a cross sectional view taken along the line A—A in FIG. 3.
Figure 7:
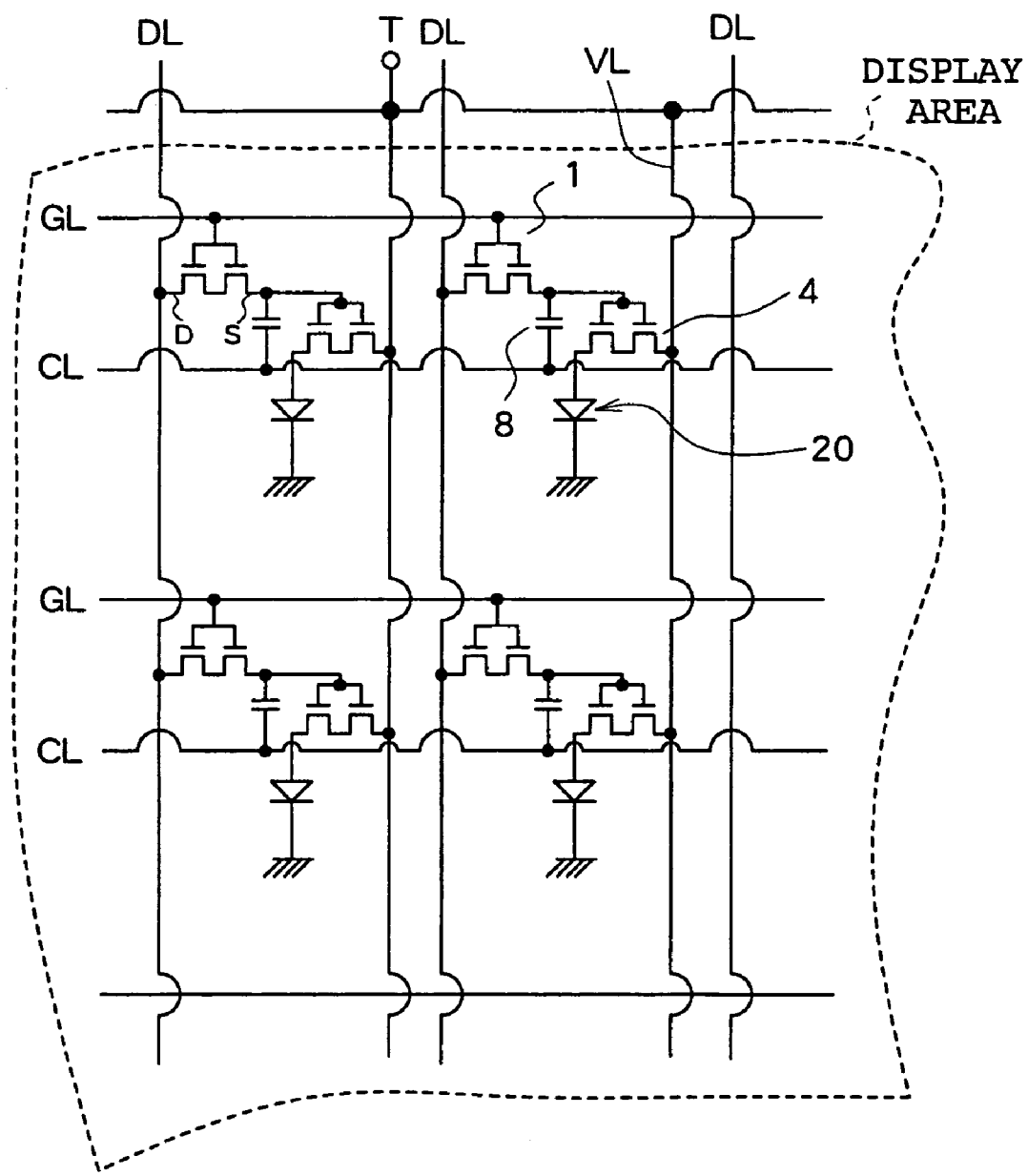
FIG. 7 is an equivalent circuit diagram of an EL display device of the present invention.

FIG. 4 and FIG. 5 are enlarged views corresponding to the portion taken along the line B—B in FIG. 3 which illustrate an important feature of the present invention. FIG. 6 is a cross sectional view taken along the line A—A in FIG. 3. FIG. 7 is an equivalent circuit diagram, where the portion surrounded by dotted lines indicates a display pixel area.

In the present embodiment, both the first and second TFTs 1 and 4 are of the bottom gate type, including a poly-Si film as an active layer. The gate electrodes 11 and 15 have a double gate structure.

An organic EL display device according to the present embodiment will be specifically described with reference to FIGS. 3 through 7.

First, a transparent substrate 10 having an insulation capability at least at the surface is provided. In the present embodiment, a metal cap (can) is provided, though unillustrated in the drawings, to seal the EL material and protect the EL element from moisture. Consequently, the emitted light is obtained from the substrate 10, and therefore the substrate 10 must be transparent, because the metal cap is opacity. However, when a transparent cap is provided so that the emitted light is obtained from this cap, the substrate 10 need not be transparent. In this example, the transparent substrate 10 formed of glass, synthetic resin, or the like, is employed.

On a main surface of the transparent substrate 10, a gate line GL extends horizontally (in a row direction) along an upper side of each pixel region shown in FIG. 3, and the gate electrodes 11 extend from the gate line GL for each pixel. A first capacitor electrode 2 serving as a lower electrode of a storage capacitor 8 is formed at the same time and of the same material as the gate. The first capacitor electrodes 2 located adjacent to each other in the row direction are connected by the capacitor line CL formed integrally with the electrodes 2. As the lines GL and CL are in the same layer formed simultaneously of the same material, as described above, they are indicated by the same hatching in FIG. 3. This layer is formed of a refractory metal, such as Cr or Ta, because the layers (12, 16, and 3) provided over this layer are formed of P-Si through an annealing process. In this embodiment, a Cr layer of about 1000–2000 Å is formed through sputtering. Taking step coverage into consideration, edges of these lines are tapered during patterning.

After forming the gate and the electrode located at the same layer, a gate insulating film 7 and a semiconductor film forming active layers of the TFTs 1 and 4 are successively formed in this order through plasma CVD over the entire substrate. As the gate insulating film 7, a Si nitride film of about 500Å and a Si oxide film of about 1300Å are successively formed in this order from the bottom, and then an a-Si film of about 500Å is formed. The semiconductor film first formed as described above an a-Si film is then turned into a p-Si film through an annealing process as described hereinafter, and used for the active layers 12 and 16 and a second capacitor electrode 3 which is an upper electrode of the storage capacitor 8. It is also noted that active layer 12 includes a first conductive region and a second conductive region and that active layer 16 includes a third conductive region IR2 and a fourth conductive region IR1.

This a-Si film is subjected to dehydrogenation annealing in a nitrogen atmosphere at a temperature of about 400° C., and turned into a p-Si film through polycrystallization with an excimer laser. The numeral 13 indicates a stopper insulating film formed of a Si oxide film serving as a mask during ion implantation into the active layers 12 and 16. This stopper insulating film is not necessary if a resist mask is used as the implantation mask. The resist mask is removed after ion doping. The second TFT 4 shown in FIG. 5 has a structure formed by using the resist mask as a doping mask, as in the latter option. While either mask type can be used, the first and second TFTs provided on the same substrate are generally formed by using the same type of mask.

The first TFT 1 is formed as an N-channel TFT with P (phosphorous) ions doped therein, while the second TFT 4 is formed as a P-channel TFT with B ions doped therein.

The p-Si film is patterned to a desired shape as shown in FIG. 3 through photolithography. The P-Si layer constituting the active layer of the first TFT 1 overlaps a data line DL in the vicinity of an upper-left intersection of the gate line GL and the data line DL, and bestrides the gate electrode 11. The second capacitor electrode 3 formed integrally with this active layer also extends overlapping the first capacitor electrode 2. The second capacitor electrode 3 is connected to the gate electrode 15 of the second TFT 4 through the connection line 30 extending on the right side, as viewed in FIG. 3, of the gate electrode 15 and formed over the gate electrode 15 in a later step. The P-Si layer constituting the active layer 16 of the second TFT 4 is patterned so as to extend under a power source line (drive line). VL disposed on the right side of each display pixel, over the second gate electrode 15, and then under the anode 6 formed of the transparent electrode.

An interlayer insulating film 14 is formed over the entire surface. This interlayer insulating film 14 is of a three-layer structure including a Si oxide film of about 1000 Å, a Si nitride film of about 3000 Å, and a Si oxide film of 1000 Å, stacked in this order from the bottom through sequential CVD. It should be noted, however, that this interlayer insulating film is required to have at least a single layer and that the thickness of the films are not limited to the above examples.

On the interlayer insulating film 14 are formed the data line DL extending in a column direction of the pixel as shown in FIG. 3, the power source line VL, and the connection line 30 for connecting the second capacitor electrode 3 and the gate electrode 15 of the second TFT 4. A contact hole is formed at a predetermined position of the interlayer insulating film 14, and respective semiconductor layers are exposed at the bottom of a contact hole C1 for the data line DL and the active layer of the first TFT 1, a contact hole C2 for the power source line VL and the active layer of the second TFT 4, and a contact hole C4 for the connection line 30 and the capacitor electrode 3. In contrast to these contact holes, at a contact hole C5 for the line connection 30 and the second gate electrode 15, a Cr film used for the gate electrode 15 is exposed because not only the interlayer insulating film 14 but also the gate insulating film are provided between these layers and the gate insulating film is also etched. In the contact holes C1, C2, C4, and C5, respective line materials are filled, including a lower Mo layer of 1000 Å, and an upper Al layer of 7000 Å, wherein the Mo layer serves as a barrier layer.

On these lines and the interlayer insulating film 14, a planarized film 18 of an insulating material having a thickness of about 1–3 μm is formed over the entire surface. The planarized film 18 is included because of the emissive element film EM of the organic EL element. This film EM includes a first hole transport layer 21, a second hole transport layer 22, an emissive layer 23, and an electron transport layer 24. The hole transport layers may be formed of a single layer. Because such an organic EL element is composed of stacked thin films and driven by an electric current, respective thin films must be formed with a highly uniform thickness. Otherwise, variations in thickness lead to a larger amount of current flowing through portions with a smaller thickness, thereby creating points emitting much brighter light than the rest of the display. The organic film is likely to undergo accelerated deterioration at these points, leading to, in the worst case, breakdown. In order to prevent such breakdown, it is necessary to make the entire surface including the anode 6 as flat as possible. In this example, as a liquid acrylic resin is applied which has fluidity, a flat upper surface can be obtained before being cured, and naturally the surface remains flat after being cured. The material of the planarized film 18 is not limited to the acrylic resin.

In the present embodiment, the anode 6 and the source of the second TFT 4 must be connected, and therefore a contact hole C3 is formed through the planarized film 18 and the interlayer insulating film 14. Through this contact hole C3, the second active layer 16 is connected to the transparent electrode forming the anode 6 of an organic EL element 20.

The anode 6 is patterned, for example, as shown in FIG. 3, and an organic film forming the EL element is formed in a region covering at least the anode 6. More specifically, on the anode 6, the organic film includes the emissive layer EM composed of the first hole transport layer 21 formed of MTDATA: 4,4',4''-tris(3-methylphenylphenylamino)triphenylamine, the second hole transport layer 22 of TPD: N,N'-diphenyl-N,N'-di(3-methylphenyl)-1,1'-biphenyl-4,4'-diamine, the emissive layer 23 of $Bebq_2$: bis(10-hydroxybenzo[h]quinolinato)beryllium including quinacridone derivatives, and the electron transport layer 24 of $Bebq_2$, and a cathode 25 formed of a magnesium-silver (Ag) alloy, an Al—Li alloy, Al/LiF, or the like, stacked from the bottom. The cathode 25 is composed of stacked layers of Al and LiF. (It is substantially formed of an alloy of these materials because an LiF layer is extremely thin.)

While the anode 6 must be patterned for each pixel, the types of films provided on the anode 6 are classified in accordance with the structure as follows:
1) a structure wherein the layers from the anode 6 to the cathode 25 are patterned for each pixel;
2) a structure wherein among the the layers from the anode 6 to the cathode 25, only the cathode 25 is not patterned and formed over substantially the entire display area; and
3) a structure wherein only the anode 6 is patterned for each pixel as shown in FIG. 3, and the layers from the layer immediately on top of the anode to the cathode are formed over the entire display area.

As it is not particularly necessary to pattern the cathode 25, it is generally formed over the entire area. Another planarized film may further be formed on the planarized film 18 to cover the edge of the anode 6.

A metal cap is bonded onto the main surface of the substrate 10 for separating, from the external environment, at least an EL layer of the display area, and preferably the entire region on the substrate 10 where the EL layer is provided. The purpose of such a provision is to seal the display area with the cap so as to prevent any moisture from entering the sealed area because the EL layer is degraded by absorbing moisture. The cap may, therefore, be replaced with a film highly resistant to moisture, such as a resin film, or a metal cap may be provided on such a film.

The light emitting principles and operations of the organic EL element will be described. Holes and electrons injected from the anode 6 and the cathode 25, respectively, are recombined in the emissive element layer EM, thereby exciting organic molecules contained in the emissive layer 23 and generating excitons. Light is released from the emissive layer 23 during the process in which the excitons deactivate, and this release of light to the outside from the transparent anode 6 through the transparent insulating substrate 10 is explained.

The present invention utilizes a structure suppressing light emitted from the EL element 20, more specifically the emissive layer, from entering the active layer of an EL display device structured as outlined above.

The regions of the poly-Si layer (active layer) 16 indicated by hatching in FIG. 4 are the regions doped with impurities. Interfaces (diffusion area interfaces: channel interfaces) between the impurity doped region and an intrinsic layer are denoted as SF1, SF2, SF3, and SF4 from the left of the figure. While a double gate structure with divided gates is employed for the TFT 4 shown in FIG. 4, there will be no interfaces SF2 and SF3 if the two gates shown in FIG. 4 are integrated.

A first feature of the present invention lies in that the diffusion area interface SF1 is spaced apart from the EL element (especially the emissive layer). By thus providing a space, light can be suppressed from entering the diffusion area interface. As a depletion layer is produced especially in the vicinity of the diffusion area interface SF1, generation of a leak current becomes more conspicuous when light impinges on the interface SF1. A depletion layer is also produced at, for example, the interface SF4, and a leak current is generated when light impinges thereon. However, in this embodiment, a leak current from the drain side of the first and second TFTs 1 and 4 flows into the source region through the gate electrodes 11 and 15, and therefore all currents including the leak current can be controlled by the gate electrodes 11 and 15. On the other hand, at the interface SF1 located on the source region side, especially the interface SF1 of the second TFT 4, the current flows directly into the EL element without passing through the control electrodes, and therefore the problem is aggravated. Consequently, the interface SF1 is preferably positioned as far apart from the EL element 20 as possible in the present embodiment. FIG. 3 and FIG. 4 illustrate a structure wherein the second gate electrode 15 is positioned closer to the power source line VL and the interface SF1 is provided as far apart from the EL element 20 as possible.

As an example of structure for preventing light from entering the active layer of the TFT, the light shielding films BM1 and BM2 as shown in FIG. 6 and FIG. 5 can be employed for the first and second TFTs 1 and 4, respectively. Referring to FIG. 6, the light shielding film BM1 is positioned overlying the first active layer 12 and underlying an EL element portion for the display pixel located immediately above as viewed in FIG. 3. More specifically, as all the EL element portions are formed on the planarized film 18 as shown in FIG. 5, the light shielding film BM1 can be formed as an island simultaneously with the data line DL, the power source line VL, and the like, prior to formation of the planarized film 18.

As shown in FIG. 5, the light shielding film BM2 for the second TFT 4 is provided between the EL element 20 and the active layer 16. Especially in this example, the source electrode SE formed of the same material as the power source line VL (drain electrode DE) extends toward the right side of FIG. 5 (the active region side) to cover the interface SF1, thereby forming the light shielding film BM2. As a result, light emitted from the EL element is prevented from reaching the interface SF1 as indicated by the arrow. Further, generation of a leak current due to light shining on the interface SF can more reliably be prevented by positioning the film BM2 as close as possible to the drain electrode DE, while maintaining the distance of not creating a short circuit with the drain, to cover the interface SF4 as indicated by the dotted line. With such a configuration, the light shielding film BM2 may be extended from the source electrode SE toward over the active region.

While the light shielding film BM1 shown in FIG. 3 is formed as an island over the active region 12, the drain electrode DE may extend to the active region as indicated by the dotted lines in FIG. 6. In addition, the light shielding film BM2 shown in FIG. 5 may also be provided as an island as the film BM1 in FIG. 3.

Referring to FIG. 5, the contact hole C3 is a hole formed in the planarized film 18 and the interlayer insulating film 14 for bringing the source region S of the active layer 16 into contact with the anode 6 through the source electrode SE. It should be noted that in FIG. 5 the region denoted by (a) shows an example of a planar structure of the second TFT 4 and the region (b) shows a cross sectional structure taken along the line C—C in the region (a).

While the structures of the films BM1 and BM2 in the TFTs of the bottom gate type are described above, the present invention is also applied to the TFTs of the top gate type, which will be described as a second preferred embodiment of the present inevention.

Figure 8A:
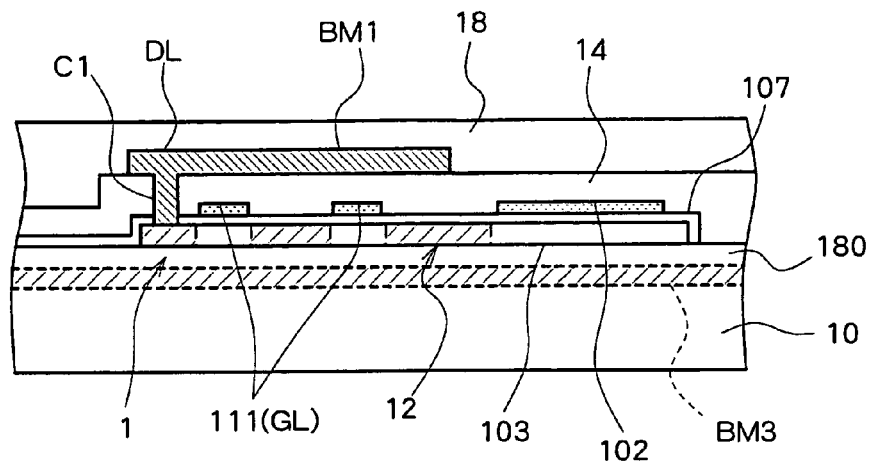
FIG. 8A is a cross sectional view of the EL display device including a TFT of the top gate type taken along the line A—A in FIG. 3.
Figure 8B:
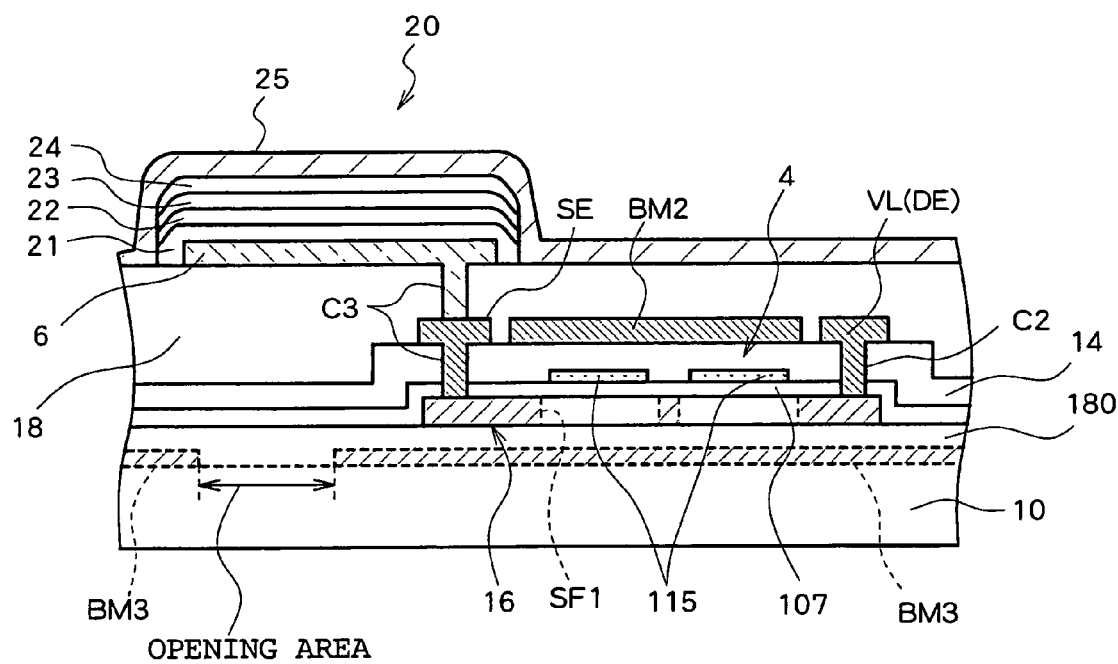
FIG. 8B is a cross sectional view of the EL display device including a TFT of the top gate type taken along the line B—B in FIG. 3.

The planar pattern of the TFTs of the top gate type is substantially the same as that of the TFTs of the bottom gate type shown in FIG. 3 and FIG. 5. The cross sections corresponding to the lines A—A and B—B in FIG. 3 are shown in FIG. 8A and FIG. 8B, respectively. The portions in FIGS. 8A and 8B identical to those in the drawings referred to in the above description are labeled with identical numerals and characters.

An insulating layer 180 is first formed over the entire surface of the substrate 10. This insulating layer 180 is composed of a lower Si nitride film of 500 Å, and an upper Si oxide film of 1000 Å. The Si nitride film serves as a stopper for impurities dispersed from glass.

Semiconductor layers (p-Si or a-Si layers) are formed at regions where the active layer 12 of the first TFT 1, a lower electrode (second electrode 103) of the storage capacitor 8 integrally formed with the active layer 12, and the second active layer 16 of the second TFT 4 are formed.

A gate insulating film 107 is disposed over the entire surface covering these semiconductor layers, and, in the first TFT 1, a gate electrode 111 and the gate line GL integral with the gate electrode 111 are formed on the film 107 as shown in FIG. 8A. Simultaneously, an upper electrode (first electrode 102) of the storage capacitor 8 is formed of the same material in the same layer as the gate electrode 111. The first electrode 102 corresponding to the first capacitor electrode 2 shown in FIG. 3 is formed integrally with the storage capacitor line CL, and extends in the row direction. In the second TFT 4, a gate electrode 115 shown in FIG. 8B is formed at the same time and of the same material as the gate electrode 111 of the first TFT 1. For these gate electrodes, a material containing Al as the main component in addition to a refractory metal mentioned above may be employed. The reason why Al can be used is that the interlayer insulating film 14 can be formed at a low temperature through plasma CVD or the like.

The semiconductor layers serving as the active layers 12 and 16 are doped with impurities using as a mask the gate electrodes 111 and 115 patterned in a predetermined shape, so that a channel region is formed immediately under the gate, and source and drain regions are formed on both sides thereof. As a P-channel TFT and an N-channel TFT are to be formed, in doping one TFT with impurities of the conductive type of either P or N, the other TFT region is masked with resist, which also applies to the bottom gate type structure. After the doping of impurities, the semiconductor layers are patterned, and the gate insulating film 107 is then formed. The semiconductor layer constituting the lower electrode 103 of the storage capacitor 8 is not doped with impurities because the upper electrode 102 formed of the same material as the gate lies over this semiconductor layer. However, this layer is used as an electrode by applying a voltage equal to or higher than that provided to the first gate electrode 111, and generating a channel at the semiconductor layer.

After the doping process, the interlayer insulating film 14 is formed, followed by formation of the data line DL, the power source line VL, and the planarized film 18 thereon. As shown in FIG. 8B, the transparent electrode is formed as the anode 6. The anode 6 and the second TFT 4 are connected through the source electrode SE, formed as the same layer as the power source line VL, in the contact hole C3 similarly to the structure shown in FIG. 5(b). The source electrode SE may extend to cover the entire active layer to form the light shielding film BM2, or the light shielding film BM2 may be formed as an island as shown in FIG. 8B. Alternatively, the drain electrode may be extended. However, because the source electrode SE is located nearest the EL element 20, the option of providing an extended source electrode SE can more reliably prevent light from entering the interface SF1. The light shielding film BM2 need not be provided, and instead the interface SF1 may be positioned as far apart from the EL element 20 as possible as shown in FIG. 4.

Meanwhile, the light shielding film BM1 shown in FIG. 8A may extend from the data line DL (drain electrode), or may be provided as an island as shown in FIG. 8B.

The EL element 20 has the same structure as that of the previously described embodiment.

In either the top gate structure or the bottom gate structure, a light shielding film BM3 may be provided between the substrate 10 and the active layers 12 and 16 to thereby prevent external light introduced from the layer underlying the transparent substrate from entering the active layers 12 and 16. Especially in the TFT of the top gate type, such a light shielding film is preferably provided between the substrate 10 and the active layers 12 and 16.

As indicated by the dotted lines in FIGS. 8A and 8B, the light shielding film BM3 may be applied, for example, directly on the transparent substrate 10, and an opening is provided therein for exposing the EL element 20 (anode 6). A refractory metal is one preferred material, and a Cr film of 1000–2000 Å is used in this example. An insulating film is provided on the light shielding film BM3 so as to maintain insulation between the film and the active layer or the conductive material for the gate or lines formed thereon. The insulating film 180 shown in FIGS. 8A and B, for example, can be used for this purpose. A structure in which a Si nitride film of 500 Å and a Si oxide film of 1000 Å stacked, in that order, from the bottom, for example, can be employed. While FIGS. 8A and 8B show an example where the film BM3 is used in combination of the films BM1 and BM2, only the film BM3 may be employed. It should be noted, however, that at least one of the films BM1 and BM2 is required for shielding light from the EL element.

The light shielding film BM3 has an opening to expose the anode 6, but the rest of the film BM3 covers the entire surface of the substrate 10, thereby preventing external light from entering except at the opening for the anode, and thereby ensuring even more reliable prevention of leak current.

The light shielding films BM1, BM2, and BM3 employed in this embodiment has a very small resistance with small variation. Therefore, by electrically connecting the light shielding films to the power source line VL, and to a power source input terminal T shown in FIG. 7, a voltage applied to the EL element 20 through the TFT 4 for each pixel can be made more uniform. This power source input terminal T is connected to the power source. As the light shielding films BM1 and BM2 shown in FIGS. 8A and 5, for example, are integral with the data line DL and the source electrode, respectively, these films BM1 and BM2 cannot be connected to the power source. On the other hand, the films BM1 and BM2 formed as an island shown in FIGS. 6 and 8B, respectively, and BM3 can be connected to the power source line VL or the terminal T as described above.

As can be seen from the equivalent circuit diagram of FIG. 7, the power source line VL extends in the column direction in the display area, and is connected to each display pixel arranged in the column direction to supply a current for driving the EL element. As the power source line VL is quite long on the whole display area, the line resistance is generated. However, by connecting the light shielding film BM (especially BM3) to the power source line VL, adjacent display pixels and, therefore, each pixel in the entire display area receive a voltage at substantially the same potential. In addition, a current is also supplied from the light shielding film BM3, so that a current at the value that should be supplied in accordance with the display data can be supplied to the organic EL element provided for each display pixel, thereby preventing voltage from dropping due to line resistance, and therefore preventing degradation in display or diminished display brightness.

Next, the contact holes for connecting the above power source line VL and the light shielding film will be described when the light shielding film, such as BM1 in FIG. 6, BM2 in FIG. 8B, or BM3, is provided. The purpose of providing a "contact" between the above-described light shielding film and the power source can be achieved by creating at least one contact hole in the substrate 10. However, creating a small and fixed number of "contact" holes for each pixel leads to an even more uniform distribution of resistance and voltage in the display area, whereby a current at the value that should be supplied, i.e. the luminance that should be obtained, can be more accurately reproduced. When the power source is electrically connected to the light shielding film BM3 and the like, an alternative structure where the drain of the second TFT is connected to the film BM3 and no power source line VL is provided may also be employed.

While a p-Si film is used as a semiconductor film in the above embodiments, such semiconductor films as a microcrystalline silicon film or an amorphous silicon film may also be used.

By providing the light shielding film BM3 extending slightly further inward than the edge of the anode, higher contrast and sharper image display can be achieved because there is no non-emissive region in each opening, and simultaneously the resistance of the entire light shielding film BM3 can be further reduced due to increased effective area of the film BM3.

Although the above embodiments are described in the context of an organic EL display device, the present invention is not limited to such a device and can also be applied to an inorganic EL display device having an emissive layer EM made of an inorganic material, providing the similar effects.

While two TFTs are employed for each pixel, it is also possible to drive the EL element with one TFT in each pixel.

What is claimed is:

1. An EL display device having a plurality of display pixels comprising an EL element having an emissive layer between first and second electrodes; a first thin film transistor having a first conductive region formed of a semiconductor film and connected to a data line, a gate electrode connected to a gate line, and a second conductive region; and a second thin film transistor having a third conductive region formed of a semiconductor film and connected to a power source line of said EL element, a second gate electrode connected to said second conductive region of said first thin film transistor, and a fourth conductive region connected to said EL element, wherein one of a source electrode and a drain electrode having a light shielding property and connected to said third conductive region or said fourth conductive region is disposed so as to cover both a region above an interface between a channel of said second thin film transistor and said fourth conductive region and a region above an interface between said channel and said third conductive region, and said two interfaces are shielded from light emitted from said emissive layer.

2. An EL display device according to claim 1, wherein said second thin film transistor and said EL element are electrically connected via said source electrode or said drain electrode which is disposed to cover said regions above said two interfaces.

3. An EL display device having a plurality of display pixels comprising an EL element having an emissive layer between first and second electrodes, and a thin film transistor having first and second conductive regions formed of a semiconductor film, said first conductive region or said second conductive region being connected to said EL element, wherein as a light shielding film for shielding light emitted from said EL element, one of a source electrode and a drain electrode having a light shielding property and connected to said first conductive region or said second conductive region is disposed between said EL element and two interfaces, which are an interface between a channel region of said thin film transistor and said first conductive region and an interface between said channel region and said second conductive region, so as to cover regions above both interfaces.

4. An EL display device according to claim 3, wherein said thin film transistor and said EL element are electrically connected via said source electrode or said drain electrode having a light shielding property.

5. An EL display device having a plurality of display pixels comprising:

an EL element having an emissive layer between first and second electrodes; and a thin film transistor having first and second conductive regions formed of a semiconductor film, one of said first and second conductive regions being connected to said EL element provided in an upper layer; wherein a light shielding film having an opening for a portion of said EL element corresponding to a pixel is provided in a layer underlying said thin film transistor.

6. The EL display device according to claim 5, wherein a light shielding film for shielding light emitted from said EL element is further provided in a layer overlying said thin film transistor.

7. The EL display device according to claim 5, wherein said light shielding fun is electrically connected to a power source of said EL element.

8. The EL display device according to claim 5, wherein said opening of said light shielding film is located inner than an outer edge of an emissive region of said EL element.

9. An EL display device having a plurality of display pixels comprising:

an EL element having an emissive layer between first and second electrodes;

a first thin film transistor having a first conductive region formed of a semiconductor film and connected to a data line, a gate electrode connected to a gate line, and a second conductive region; and a second thin film transistor having a third conductive region formed of a semiconductor film and connected to a power source line of said EL element, a second gate electrode connected to said second conductive region of said first thin film transistor, and a fourth conductive region connected to said EL element provided in an upper layer; wherein a light shielding film having an opening corresponding to an emissive region of said EL element is provided in a layer underlying said second thin film transistor.

10. The EL display device according to claim 9, wherein a light shielding film for shielding light emitted from said EL element is provided in a layer overlying said semiconductor film of at least said second thin film transistor among said first and second thin film transistors.

11. The EL display device according to claim 9, wherein said light shielding film is electrically connected to a power source of said EL element.

12. The EL display device according to claim 9, wherein said opening of said light shielding film is located inner than an outer edge of an emissive region of said EL element.

13. An EL display device having a plurality of display pixels comprising an EL element having an emissive layer between first and second electrodes, and a thin film transistor having first and second conductive regions formed of a semiconductor film, said first conductive region or second conductive region being connected to said EL element, wherein as a light shielding film for shielding light emitted from said EL element, one of a source electrode and a drain electrode having a light shielding property and connected to said first conductive region or said second conductive region is disposed between said thin film transistor and said EL element so as to cover both an interface between channel region and said first conductive region and an interface between said channel region and said second conductive region.

14. An EL display device according to claim 13, wherein said thin film transistor and said EL element are electrically connected via said source electrode or said drain electrode having a light shielding property.

\* \* \* \* \*